US012341138B2

(12) United States Patent
Marozzi et al.

(10) Patent No.: US 12,341,138 B2
(45) Date of Patent: Jun. 24, 2025

(54) DUAL DIE INTEGRATED CIRCUIT SYSTEM IN AN INTEGRATED CIRCUIT PACKAGE WITH TWO SEPARATE SUPPLY DOMAINS

(71) Applicant: TDK—Micronas GmbH, Freiburg (DE)

(72) Inventors: Paolo Marozzi, Freiburg (DE); Ingo Freund, Freiburg (DE)

(73) Assignee: TDK—Micronas GmbH, Freiburg (DE)

( * ) Notice: Subject to any disclaimer, the term of this patent is extended or adjusted under 35 U.S.C. 154(b) by 484 days.

(21) Appl. No.: 17/955,760

(22) Filed: Sep. 29, 2022

(65) Prior Publication Data

US 2024/0088112 A1    Mar. 14, 2024

(30) Foreign Application Priority Data

Sep. 10, 2022   (DE) .................... 10 2021 125 489.2

(51) Int. Cl.
| | | |
|---|---|---|
| *H01L 23/495* | (2006.01) | |
| *G01D 5/14* | (2006.01) | |
| *G01R 33/00* | (2006.01) | |
| *G01R 33/07* | (2006.01) | |
| *H01L 21/48* | (2006.01) | |
| *H01L 23/00* | (2006.01) | |
| *H01L 25/16* | (2023.01) | |

(52) U.S. Cl.
CPC .............. *H01L 25/16* (2013.01); *G01D 5/145* (2013.01); *G01R 33/0094* (2013.01); *G01R 33/072* (2013.01); *H01L 21/4825* (2013.01); *H01L 23/49575* (2013.01); *H01L 23/49589* (2013.01); *H01L 24/48* (2013.01); *H01L 2224/48175* (2013.01); *H01L 2924/19041* (2013.01)

(58) Field of Classification Search
CPC .............. H01L 23/49589; H01L 25/16; H01L 23/49575
See application file for complete search history.

(56) References Cited

U.S. PATENT DOCUMENTS

| | | | | |
|---|---|---|---|---|
| 2002/0145180 A1* | 10/2002 | Terui | ........................ | H01L 24/32 257/676 |
| 2003/0209784 A1* | 11/2003 | Schmitz | .................... | H01L 24/06 257/664 |
| 2005/0263863 A1* | 12/2005 | Sasaki | ................. | H01L 23/49506 257/676 |
| 2014/0320124 A1* | 10/2014 | David | ................. | G01R 33/0047 324/252 |
| 2018/0061784 A1 | 3/2018 | Lamar et al. | | |
| 2018/0190599 A1 | 3/2018 | Lamar et al. | | |
| 2020/0373260 A1* | 11/2020 | Hovis | ..................... | H05K 1/141 |
| 2021/0305178 A1* | 9/2021 | West | ..................... | H01L 23/5223 |

\* cited by examiner

*Primary Examiner* — Errol V Fernandes
(74) *Attorney, Agent, or Firm* — 24IP Law Group USA, PLLC; Timothy R. DeWitt

(57) ABSTRACT

A dual die integrated circuit (IC) system (1) in an integrated circuit (IC) package (11) with two separate supply domains is provided comprising a first die (20); a second die (30); a lead frame (60) having a first ground pin (GND1), a first supply voltage (Vsup1), a second ground pin (GND2), and a second supply voltage (Vsup2), wherein the first die (20) is connected to the first ground pin (GND1) and to the first supply voltage (Vsup1) and wherein the second die (30) is connected to the second ground pin (GND2) and to the second supply voltage (Vsup2); and at least one capacitive element (70) coupled between the first ground pin (GND1) and the second ground pin (GND2) and coupled between the first supply voltage (Vsup1) and the second supply voltage (Vsup2).

15 Claims, 2 Drawing Sheets

DUAL DIE INTEGRATED CIRCUIT SYSTEM IN AN INTEGRATED CIRCUIT PACKAGE WITH TWO SEPARATE SUPPLY DOMAINS

CROSS-REFERENCE TO RELATED APPLICATIONS

This application claims priority of German Patent Application number DE 10 2021 125 489, filed on 1 Oct. 2021. The entire disclosure of the German Patent Application number DE 10 2021 125 489 is hereby incorporated herein by reference.

BACKGROUND OF THE INVENTION

Field of the Invention

The invention relates to a dual die integrated circuit (IC) system in an integrated circuit (IC) package with two separate supply domains, a method for assembly the dual die integrated circuit (IC) system in the integrated circuit package with two separate supply domains, and the use of the dual die integrated circuit (IC) system in the integrated circuit (IC) package with two separate supply domains.

Brief Description of the Related Art

Integrated circuit chips are typically enclosed in protective packages that can be easily handled and mounted onto printed circuit boards (PCB). A single package can be used to enclose one or more integrated circuit chips therein.

Dual-die packaging technology is used to pack two integrated circuit chips in one single package module, so that one single package module is capable of offering a double level of functionality or data storage capacity. Memory chips, such as flash memory chips, are typically packaged in this way so as to allow one single memory module to offer a doubled level of data storage capacity. Conventionally, various kinds of dual-die packaging technologies have been developed and utilized in the semiconductor industry.

Conventional dual-die package structure comprises a first semiconductor die, a second semiconductor die, and a lead frame. The first semiconductor die has a circuit surface (or called active surface) and a non-circuit surface (or called inactive surface) and is formed with a lined array of bond pads on one edge of the circuit surface thereof. Similarly, the second semiconductor die has a circuit surface and a non-circuit surface and is formed with a lined array of bond pads on one edge of the circuit surface thereof. The first semiconductor die and the second semiconductor die can also be various other kinds of integrated circuit chips, such as microcontroller chips.

The conventional dual-die package structures offer however a poor grounding due to the floating integrated circuits and the single lead frame. In addition, the poor grounding is decreasing the effect of external filtering due to ground lifting.

Therefore, a dual die integrated circuit (IC) system in an integrated circuit (IC) package is required preventing the poor grounding.

SUMMARY OF THE INVENTION

According to a first aspect of the invention, a dual die integrated circuit system in an integrated circuit package with two separate supply domains is provided, comprising a first die, a second die, a lead frame, and at least one capacitive element. The lead frame comprises a first ground pin, a first supply voltage, a second ground pin, and a second supply voltage. The first die is connected to the first ground pin and to the first supply voltage. The second die is connected to the second ground pin and to the second supply voltage. The at least one capacitive element is coupled between the first ground pin and the second ground pin and/or coupled between the first supply voltage and the second supply voltage. By decoupling the two grounds through a capacitor in the integrated circuit package the grounding effects can be maximized therefore offering less resistance and reducing the effect of RF signals.

In one aspect of the dual die integrated circuit system, the dual die integrated circuit (IC) system is arranged in a stacking arrangement or in a side-by-side arrangement.

In further aspect of the dual die integrated circuit system, the dual die integrated circuit (IC) system further comprises a spacer element, which is arranged between the first die and the second die.

In further aspect of the dual die integrated circuit system, the dual die integrated circuit (IC) system further comprises a support element on which at least one of the first die and the second die is arranged.

In one aspect of the dual die integrated circuit system, the at least one of the first die and the second die is a sensor element. The sensor element of at least one of the first die and the second die is an optical sensor, acceleration sensor, or Hall-sensor.

In further aspect of the dual die integrated circuit system, the at least one capacitive element is integrated in the support element.

In further aspect of the dual die integrated circuit system, the support element is connected to the lead frame.

In one aspect of the dual die integrated circuit system, the first die has at least one first magnetic sensor array and/or the second die has at least one second magnetic sensor array.

According to a second aspect of the invention, the dual die integrated circuit (IC) system in the integrated circuit (IC) package with two separate supply domains according to any of the above aspects is used for non-contact measuring of the magnetic field of a rotating magnet for determining the angle of rotation.

According to a third aspect of the invention, the dual die integrated circuit (IC) system in the integrated circuit (IC) package with two separate supply domains according to any of the above aspects is used for non-contact measuring of the magnetic field of a magnet from the group of cylindrical magnets and rod-shaped magnets.

According to a fourth aspect of the invention, a method for assembly a dual die integrated circuit (IC) system in an integrated circuit (IC) package with two separate supply domains is provided, the method comprising the steps of: Providing a first die; providing a second die; connecting the first die to a first ground pin and to a first supply voltage on a lead frame; connecting the second die to a second ground pin and to a second supply voltage on the lead frame; and coupling a capacitive element between the first ground pin and the second ground pin, and coupling at least one capacitive element between the first ground pin and the second ground pin and/or between the first supply voltage and the second supply voltage.

In one aspect of the method, the method further comprises the step of arranging a spacer element between the first die and the second die.

In a further aspect of the method, the method further comprises the step of arranging at least one of the first die and the second die on a support element.

BRIEF DESCRIPTION OF THE DRAWINGS

The invention will now be described on the basis of figures. It will be understood that the embodiments and aspects of the invention described in the figures are only examples and do not limit the protective scope of the claims in any way. The invention is defined by the claims and their equivalents. It will be understood that features of one aspect or embodiment of the invention can be combined with a feature of a different aspect or aspects of other embodiments of the invention. This invention becomes more obvious when reading the following detailed descriptions of some examples as part of the disclosure under consideration of the enclosed drawings, in which:

DETAILED DESCRIPTION OF THE INVENTION

The invention will now be described on the basis of the drawings. It will be understood that the embodiments and aspects of the invention described herein are only examples and do not limit the protective scope of the claims in any way. The invention is defined by the claims and their equivalents. It will be understood that features of one aspect or embodiment of the invention can be combined with a feature of a different aspect or aspects and/or embodiments of the invention. The object of the present invention is fully described below using examples for the purpose of disclosure, without limiting the disclosure to the examples. The examples present different aspects of the present invention. To implement the present technical teaching, it is not required to implement all of these aspects combined. Rather, a specialist will select and combine those aspects that appear sensible and required for the corresponding application and implementation.

Figure 1:
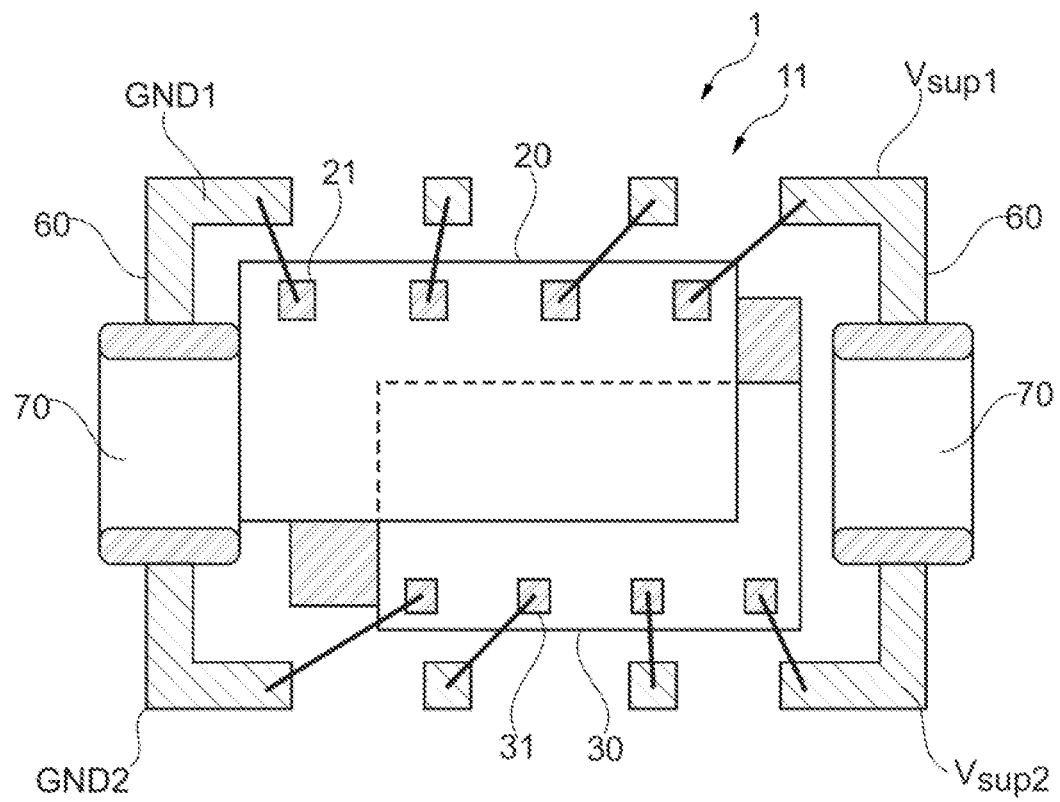
FIG. 1 is a schematic top view of the dual die integrated circuit system in an integrated circuit package with two separate supply domains according to the first aspect of the present invention.

FIG. 1 is a schematic top view of the dual die integrated circuit (IC) system 1 in an integrated circuit (IC) package 11 with two separate supply domains according to the first aspect of the present invention. The dual die integrated circuit (IC) system 1 comprises a first die 20, a second die 30, a lead frame 30, and at least one capacitive element 70. The lead frame 60 comprises a first ground pin (GND1), a first supply voltage (Vsup1), a second ground pin (GND2), and a second supply voltage (Vsup2), wherein the first die 20 is connected to the first ground pin (GND1) and to the first supply voltage (Vsup1) and wherein the second die 30 is connected to the second ground pin (GND2) and to the second supply voltage (Vsup2). As shown in FIG. 1, the first die 20 comprises at least one first magnetic sensor array 21 and the second die 30 comprises at least one second magnetic sensor array 31. The first die 20 is connected to the first ground pin (GND1) via the at least one first magnetic sensor array 21 and to the first supply voltage (Vsup1) via the at least one first magnetic sensor array 21. The second die 30 is connected to the second ground pin (GND2) via the at least one second magnetic sensor array 31 and to the second supply voltage (Vsup2) via the at least one second magnetic sensor array 31. The least one capacitive element 70 is coupled between the first ground pin (GND1) and the second ground pin (GND2) and/or is coupled between the first supply voltage (Vsup1) and the second supply voltage (Vsup2). As shown in FIG. 1, a first capacitive element 70 is coupled between the first ground pin (GND1) and the second ground pin (GND2) and a second capacitive element 70 is coupled between the first supply voltage (Vsup1) and the second supply voltage (Vsup2). As shown in FIG. 1., the first die 20 is connected to other pins on the lead frame 60 via the at least one first magnetic sensor array 21, these pins could be test-pins or out-pins, however, the present is not limited to any kind of these other pin. As shown in FIG. 1., the second die 30 is also connected to other pins on the lead frame 60 via the at least one second magnetic sensor array 31, these pins could be test-pins or out-pins, however, the present is not limited to any kind of these other pins.

At least one of the first die 20 and the second die 30 is a sensor element. In particular, the first die 20 and the second die 30 is an optical sensor, acceleration sensor, or Hall-sensor.

Figure 2:
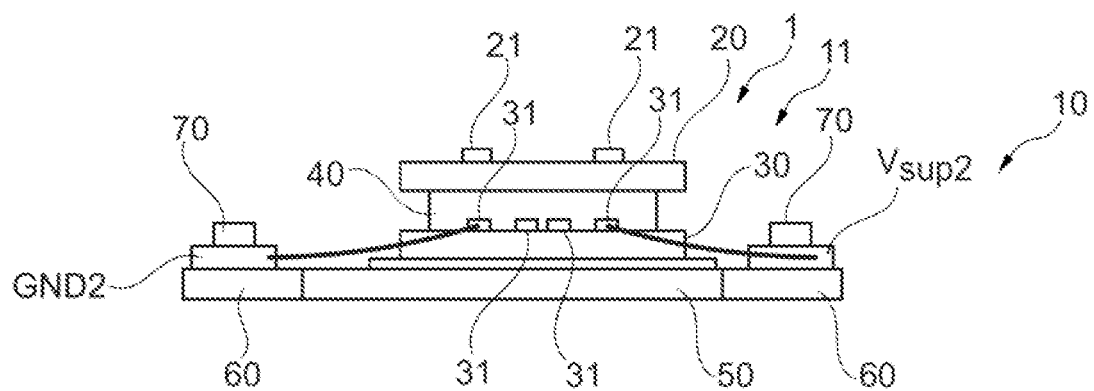
FIG. 2 is a schematic side view of a dual die integrated circuit system in an integrated circuit package with two separate supply domains according to another aspect of the present invention in a stacking arrangement.

FIG. 2 is a schematic side view of a dual die integrated circuit (IC) system 1 in an integrated circuit package 11 with two separate supply domains according to another aspect of the present invention in a stacking arrangement 10. The first die 20 has at least one first magnetic sensor array 21 and/or the second die 30 has at least one second magnetic sensor array 31. The stacking arrangement 10 is housed in a small outline integrated circuit (SOIC) package 11. In particular, the stacking arrangement 10 is housed in a SOIC8 package 11. As shown in FIG. 2, the dual die integrated circuit (IC) system 1 in an integrated circuit (IC) package 11 according to another aspect of the present invention further comprises a spacer element 40, which is arranged between the first die 20 and the second die 30. The dual die integrated circuit (IC) system 1 further comprises a support element 50 on which at least one of the first die 20 and the second die 30 is arranged. The capacitive element 70 can be integrated in the support element 50. The support element 50 is connected to the lead frame 60. The first die 20 is connected to other pins (not shown in FIG. 2) on the lead frame 60 via the at least one first magnetic sensor array 21, these pins could be test-pins or out-pins, however, the present is not limited to any kind of these other pin. The second die 30 is also connected to other pins (not shown in FIG. 2) on the lead frame 60 via the at least one second magnetic sensor array 31, these pins could be test-pins or out-pins, however, the present is not limited to any kind of these other pins.

Figure 3:
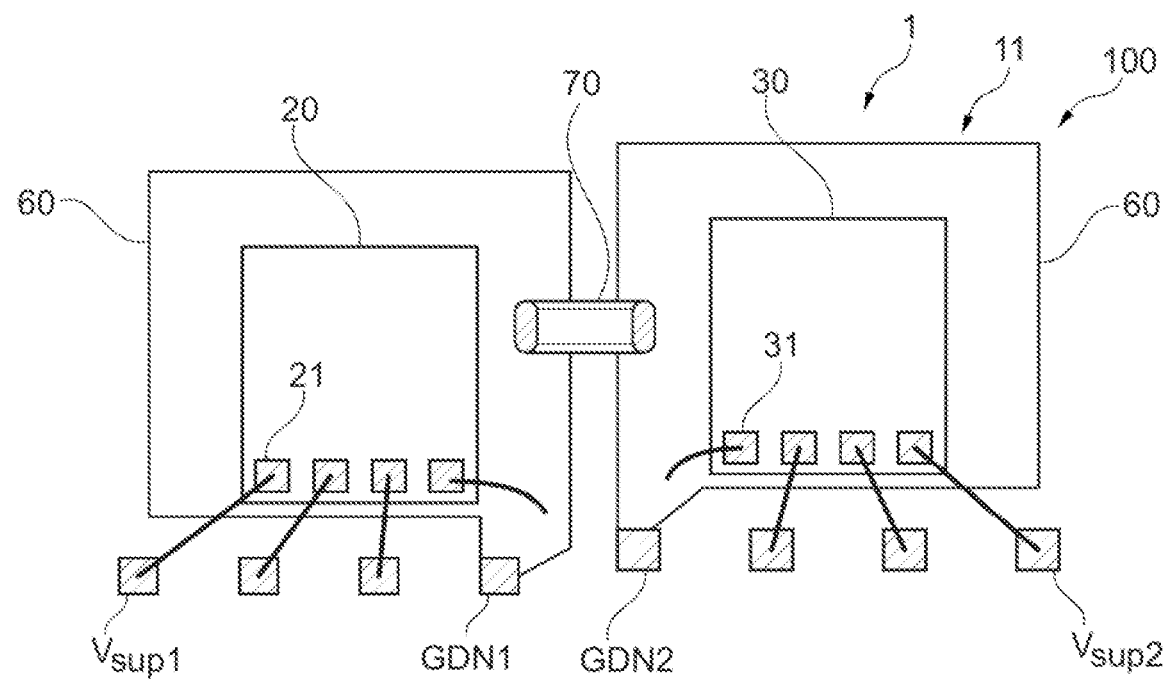
FIG. 3 is a schematic side view of the dual die integrated circuit system in an integrated circuit package with two separate supply domains according to the first aspect of the present invention in a side-by-side arrangement.

FIG. 3 is a schematic side view of the dual die integrated circuit (IC) system 1 in the integrated circuit package 11 with two separate supply domains according to the first aspect of the present invention in a side-by-side arrangement 100. As shown in FIG. 2, the lead frame 60 in the side by side arrangement 100 comprises the first ground pin (GND1), the first supply voltage (Vsup1), the second ground pin (GND2), and the second supply voltage (Vsup2), wherein the first die 20 is connected to the first ground pin (GND1) and to the first supply voltage (Vsup1) and wherein the second die 30 is connected to the second ground pin (GND2) and to the second supply voltage (Vsup2). As shown in FIG. 3, the first die 20 comprises at least one first magnetic sensor array 21 and the second die 30 comprises at least one second magnetic sensor array 31. The first die 20 is connected to the first ground pin (GND1) via the at least one first magnetic sensor array 21 and to the first supply voltage (Vsup1) via the at least one first magnetic sensor array 21. The second die 30 is connected to the second ground pin (GND2) via the at least one second magnetic sensor array 31 and to the second supply voltage (Vsup2) via the at least one second magnetic sensor array 31. The least one capacitive element 70 is coupled between the first ground pin (GND1) and the second ground pin (GND2) and/or is coupled between the first supply voltage (Vsup1) and the second supply voltage (Vsup2). As shown in FIG. 3, the capacitive element 70 is coupled between the first ground pin (GND1) and the second ground pin (GND2), however, the capacitive element 70 can also be coupled between the first supply voltage (Vsup1) and the second supply voltage (Vsup2) (not shown). Further, in the side-by-side arrangement 100, the capacitive element 70 can be coupled between the first ground pin (GND1) and the second ground pin (GND2) and a further capacitive element 70 can be coupled between the first supply voltage (Vsup1) and the second supply voltage (Vsup2) (not shown). As shown in FIG. 3., the first die 20 is connected to other pins on the lead frame 60 via the at least one first magnetic sensor array 21, these pins could be test-pins or out-pins, however, the present is not limited to any kind of these other pin. As shown in FIG. 3., the second die 30 is also connected to other pins on the lead frame 60 via the at least one second magnetic sensor array 31, these pins could be test-pins or out-pins, however, the present is not limited to any kind of these other pins.

According to a second aspect of the present invention, the dual die integrated circuit (IC) system 1 in the integrated circuit (IC) package 11 with two separate supply domains can be used for non-contact measuring of the magnetic field of a rotating magnet for determining the angle of rotation. Further, according to a third aspect of the present invention, the dual die integrated circuit (IC) system 1 in the integrated circuit (IC) package 11 with two separate supply domains can be used for non-contact measuring of the magnetic field of a magnet from the group of cylindrical magnets and rod-shaped magnets.

Figure 4:
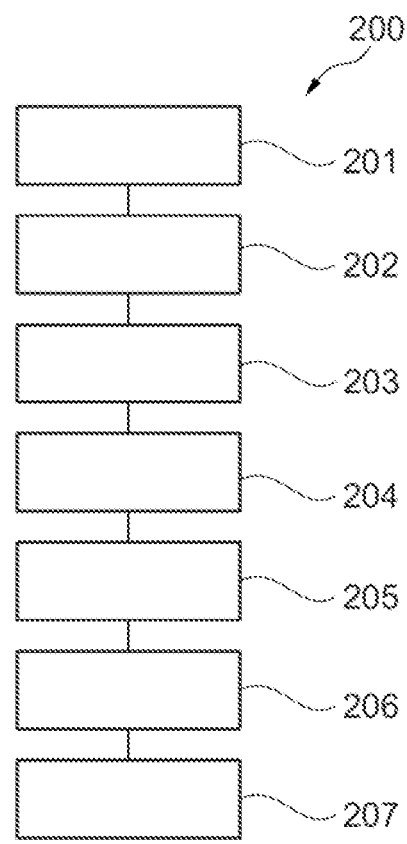
FIG. 4 is a flowchart of the method for assembly a dual die integrated circuit system in an integrated circuit package with two separate supply domains

FIG. 4 is a flowchart of a method 200 for assembly a dual die integrated circuit system in an integrated circuit package with two separate supply domains according to a fourth aspect of the present invention. The method 200 comprises the steps of providing 201 the first die 20; providing 202 the second die 30; connecting 203 the first die 20 to the first ground pin (GND1) and to the first supply voltage (Vsup1) on the lead frame 60; connecting 204 the second die 20 to a second ground pin (GND2) and to the second supply voltage (Vsup2) on the lead frame (60); and coupling 205 the at least one capacitive element 70 between the first ground pin (GND1) and the second ground pin (GND2) and/or between the first supply voltage (Vsup1) and the second supply voltage (Vsup2).

The method 200 further comprises the step of arranging 206 the spacer element 40 between the first die 20 and the second die 30. The method 200 further comprises the step of arranging 207 at least one of the first die 20 and the second die 30 on the support element 50.

From the above description of the present invention, those skilled in the art will perceive improvements, changes, and modifications on the present invention. Such improvements, changes, and modifications within the skill in the art are intended to be covered by the appended claims.

REFERENCE LIST

1 Dual die integrated circuit (IC) system
10 stacking arrangement
11 an integrated circuit (IC) package
12 side by side arrangement
20 first die
21 first magnetic sensor array
30 second die
31 second magnetic sensor array
40 spacer element
50 support element
60 lead frame
70 capacitive element
100 side by side arrangement
GND1 first ground pin
GND2 second ground pin
Vsup1 first supply voltage
Vsup2 second supply voltage

What is claimed is:

1. A dual die integrated circuit (IC) system in an integrated circuit (IC) package with two separate supply domains, comprising:
    a first die;
    a second die;
    a lead frame comprising a first ground pin (GND1), a first supply voltage (Vsup1), a second ground pin (GND2), and a second supply voltage (Vsup2), wherein the first die is connected to the first ground pin (GND1) and to the first supply voltage (Vsup1) and wherein the second die is connected to the second ground pin (GND2) and to the second supply voltage (Vsup2); and
    at least one capacitive element (70) coupled between the first ground pin (GND1) and the second ground pin (GND2) and coupled between the first supply voltage (Vsup1) and the second supply voltage (Vsup2).

2. The dual die integrated circuit (IC) system of claim 1, wherein the dual die integrated circuit (IC) system is arranged in a stacking arrangement or in a side-by-side arrangement.

3. The dual die integrated circuit (IC) system of claim 1, further comprising a spacer element, which is arranged between the first die and the second die.

4. The dual die integrated circuit (IC) system of claim 1, further comprising a support element on which at least one of the first die and the second die is arranged.

5. The dual die integrated circuit (IC) system of claim 1, wherein at least one of the first die and the second die is a sensor element.

6. The dual die integrated circuit (IC) system of claim 5, wherein the sensor element of at least one of the first die and the second die is an optical sensor, acceleration sensor, or Hall-sensor.

7. The dual die integrated circuit (IC) system of claim 4, wherein the at least one capacitive element is integrated in the support element.

8. The dual die integrated circuit (IC) system of claim 4, wherein the support element is connected to the lead frame.

9. The dual die integrated circuit (IC) system of claim 7, wherein the support element is connected to the lead frame.

10. The dual die integrated circuit (IC) system of claim 1, wherein the first die has at least one first magnetic sensor array and the second die has at least one second magnetic sensor array.

11. Use of a dual die integrated circuit (IC) system in an integrated circuit (IC) package with two separate supply domains according to claim 1 for non-contact measuring of the magnetic field of a rotating magnet for determining the angle of rotation.

12. Use of a dual die integrated circuit (IC) system in an integrated circuit (IC) package with two separate supply domains according to claim 1 for non-contact measuring of the magnetic field of a magnet from the group of cylindrical magnets and rod-shaped magnets.

13. A method for assembly a dual die integrated circuit (IC) system in an integrated circuit (IC) package with two separate supply domains, the method comprising the steps of:
providing a first die;
providing a second die;
connecting the first die to a first ground pin (GND1) and to a first supply voltage (Vsup1) on a lead frame;
connecting the second die to a second ground pin (GND2) and to a second supply voltage (Vsup2) on the lead frame; and
coupling at least one capacitive element between the first ground pin (GND1) and the second ground pin (GND2) and between the first supply voltage (Vsup1) and the second supply voltage (Vsup2).

14. The method of claim 13, further comprising the step of:
arranging a spacer element between the first die and the second die.

15. The method of claim 13, further comprising the step of:
arranging at least one of the first die and the second die on a support element.

* * * * *